Figure 1:
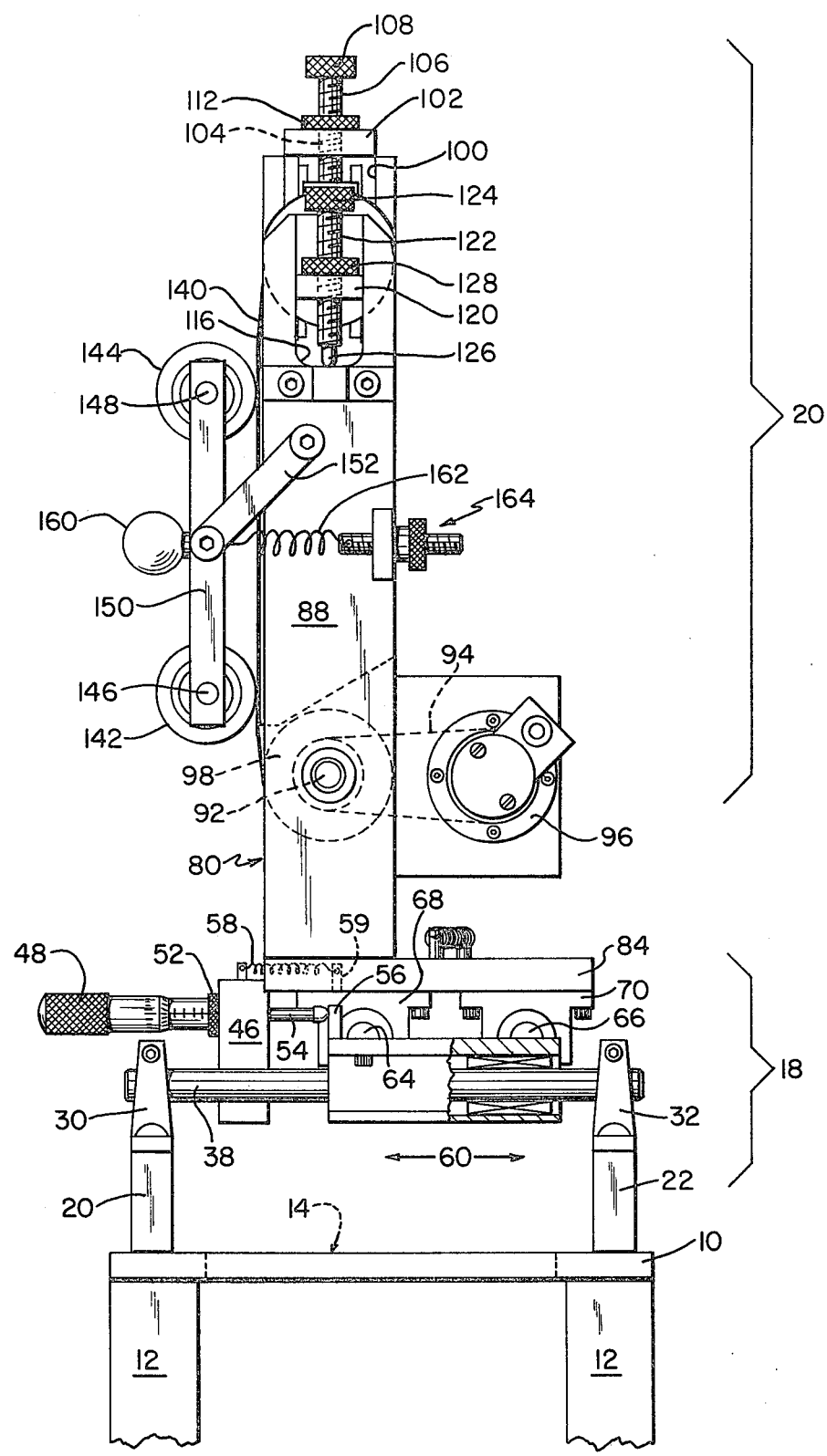

United States Patent [19]

Serafino et al.

[11] 4,317,799
[45] Mar. 2, 1982

[54] BELT-ROLLER CRYSTAL PULLING MECHANISM

[75] Inventors: John B. Serafino, Billerica; William A. Kmetz, Marlboro, both of Mass.

[73] Assignee: Mobil Tyco Solar Energy Corporation, Waltham, Mass.

[21] Appl. No.: 248,819

[22] Filed: Mar. 30, 1981

Related U.S. Application Data

[63] Continuation of Ser. No. 19,437, Mar. 12, 1979, abandoned.

[51] Int. Cl.³ .............................................. C30B 35/00
[52] U.S. Cl. .............................. 422/249; 156/617 SP; 156/DIG. 88
[58] Field of Search ......... 156/608, 617 SP, DIG. 88, 156/DIG. 96, DIG. 97, DIG. 98; 422/246, 249; 198/814, 816, 836; 226/170, 171; 65/100, 197, 198

[56] References Cited

U.S. PATENT DOCUMENTS

| | | | |
|---|---|---|---|
| 1,469,379 | 10/1923 | Callard | 156/DIG. 88 |
| 2,153,113 | 4/1939 | Winter | 266/170 |
| 2,197,811 | 4/1940 | Spinasse | 65/197 |
| 2,876,147 | 3/1959 | Kniepkamp et al. | 422/249 |
| 3,230,634 | 1/1966 | Sachs | 266/170 |
| 3,259,468 | 7/1966 | Stevens et al. | 156/DIG. 98 |
| 3,414,115 | 12/1968 | Gares et al. | 198/814 |
| 3,428,436 | 2/1969 | Tucker | 156/DIG. 98 |
| 3,516,539 | 6/1970 | Gulstrom et al. | 198/836 |
| 3,607,112 | 9/1971 | Mermelstein | 422/249 |
| 3,952,861 | 4/1976 | Holmquist et al. | 198/816 |
| 4,013,433 | 3/1977 | Briar | 266/170 |
| 4,158,038 | 6/1979 | Jewett | 422/249 |

FOREIGN PATENT DOCUMENTS 39-2753 3/1964 Japan ........................ 156/DIG. 98

*Primary Examiner*—Gregory N. Clements
*Attorney, Agent, or Firm*—Schiller & Pandiscio

[57] ABSTRACT

A belt-roller crystal pulling mechanism is described. The belt-roller comprises a single driven belt having a vertical run, and a set of pivotally mounted follower rollers for urging the growing crystal in contact with the belt. The pivot mount enables bends or buckles in the crystal to go through the belt and rollers without causing wiggle at the growth interface which might otherwise cause the growing crystal to break free from the meniscus.

16 Claims, 3 Drawing Figures

BELT-ROLLER CRYSTAL PULLING MECHANISM

This is a continuation of Ser. No. 019,437 filed Mar. 12, 1979, now abandoned.

This invention relates generally to the growth of elongate crystals from the melt and more particularly to an improved crystal pulling apparatus for use in combination with a crystal growing furnace.

A number of processes are known for growing crystalline bodies from the melt. Two prior art processes which are known to persons skilled in the art are described by U.S. Pat. Nos. 3,591,348 and 3,471,366. According to U.S. Pat. No. 3,591,348 crystalline bodies are grown according to what is commonly called the edge-defined, film-fed growth technique (commonly referred to as the EFG process). In the EFG process the shape of the crystalline body which is grown is determined by the external or edge configuration of the end surface of a forming member, which, for want of a better name is called a die. The process involves growth on a seed from melt which is located between the growing body and the end surface of the die, with the melt being continuously replenished from a suitable melt reservoir via one or more capillaries in the die. The growing body grows to the shape of the edge configuration of the top end of the die.

U.S. Pat. No. 3,471,366 discloses a related process which employs a forming member that includes a capillary for containing a supply of melt from which a crystal body is grown and pulled. Depending upon the cross-sectional configuration of the forming member and by appropriately controlling the thermal conditions in the upper end of the capillary, it is possible to grow crystal bodies of selected cross-sectional shapes.

Both of the foregoing processes are useful in growing material such as alumina and silicon in various shapes, including cylindrical tubes, filaments, and thin flat ribbons.

The growth of crystals by both of the above described processes typically involves the use of apparatus which comprises a furnace adapted to accommodate a crucible containing a source of material maintained as a melt, a capillary die with one end disposed in the melt, and pulling means for contacting the surface of the melt with a seed crystal and for slowly withdrawing the seed at a rate and under conditions such that a portion of the melt solidifies on the seed. By appropriately maintaining process conditions, a crystal of considerable length can be pulled from the melt.

In an EFG process such as above described, changes in pulling speed can effect the cross-sectional size of the growing body. One system for holding pulling speed constant is shown in U.S. Pat. No. 3,607,112 issued to Seymour Mermelstein. Mermelstein shows a crystal pulling apparatus which includes a pair of endless belts, each belt having a vertically extending run with the vertical run of one belt disposed adjacent the vertical run of the other belt so as to grip a crystalline body interposed therebetween, and drive means for moving the belts so that they run along the vertically extending run. While such an apparatus has the advantage that it can be employed for growing continuous crystals of indefinite lengths, Mermelstein reports that if the seed or growing crystal is not perfectly straight, or if the seed of crystal is slightly askew with respect to the axis of travel of the vertical runs of the belts, the crystal bottom end may tend to wiggle as it is being pulled by movement of the belts. This effect is particularly noticeable when growing flat ribbon or relatively small diameter filaments, e.g. filaments with a diameter of about five-thousandths of an inch. The shorter the filament or seed, the more critical is the wiggling since the lateral forces of the filament or seed with respect to the melt at the growth interface caused by the wiggling are directly proportional to the length of the filament or seed between the pulling belts and the growth interface. If the filament length is relatively short, the lateral forces may be sufficient to overcome the surface tension of the melt, and hence the end of the filament or seed will tend to move laterally thereby causing the filament to grow crooked, or in the extreme case break free of the melt. A similar problem exists in growing flat plates. In order to minimize this problem Mermelstein mounts his endless belts on a vertically moveable carriage so that initial pulling can be effected by movement of the carriage rather than movement of the belts. According to Mermelstein vertical movement of the carriage does not produce wiggle; thus crystal growth will occur along the path of vertical movement of the carriage. When the crystal has grown to a substantial length, the belts may then be used for pulling since, at that point, any wiggle effect seen at the growth interface typically will be insufficient to overcome the surface tension of the melt. Hence the wiggling will not cause the growing crystal to break free of the melt and the crystal will grow straight.

While the Mermelstein patented apparatus offers a solution to the problem of wiggling, the Mermelstein apparatus is relatively complicated and thus is relatively expensive to build. Also, the Mermelstein apparatus requires separate drive means and control means for the belts and the carriage which further adds to the cost of the apparatus.

Accordingly, it is a primary object of this invention to provide a new and improved apparatus for growing selected crystalline materials from the melt.

Other objects are to provide a crystal-growing apparatus which is simple in construction, simple to control, reliable in operation, and adapted to grow elongated crystalline bodies of extended lengths.

A more specific object is to provide a crystal pulling apparatus of the foregoing type for growing flat crystalline ribbons of indefinite lengths.

The foregoing objects and other objects hereinafter described or rendered obvious are achieved by an apparatus which essentially comprises a crystal pulling mechanism in the form of a single endless belt having a vertically extending run, at least two vertical spaced follower rollers pivotally mounted adjacent the belt vertical run for urging the crystal to be pulled into frictional contact with the belt, and drive means for moving the belt so that the belt runs upward along the vertically extending run.

Figure 2:
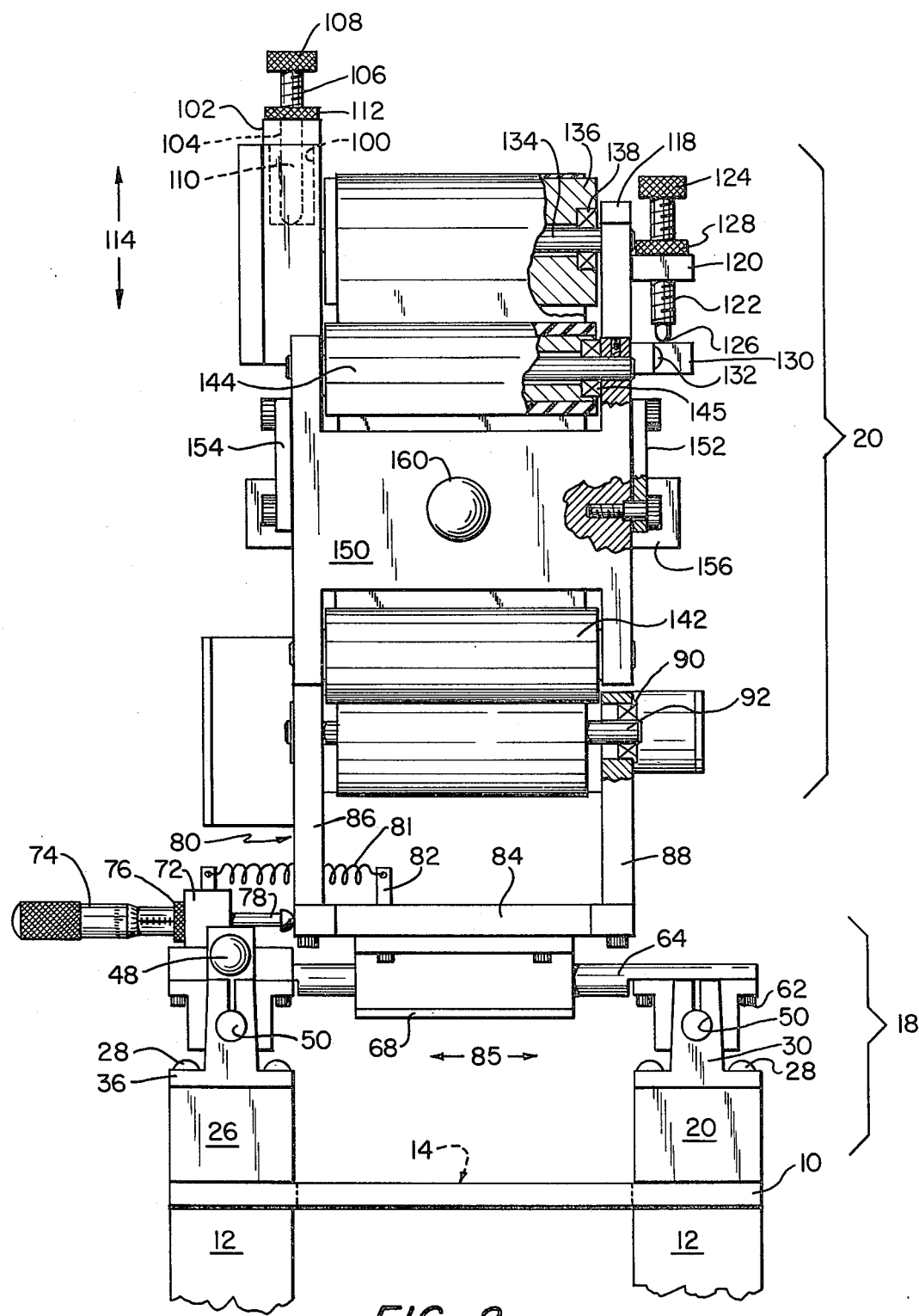
Figure 3:
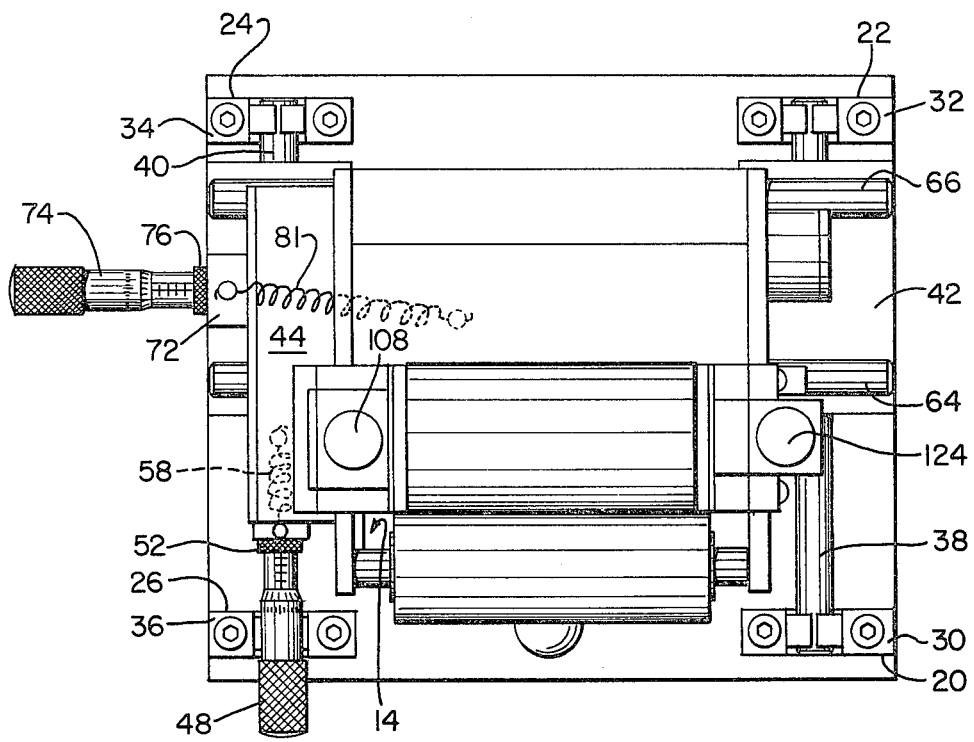

Other features and many of the attendant advantages of the invention are presented in the following detailed description which is to be considered together with the accompanying drawings; wherein FIG. 1 is a side elevational view of a preferred embodiment of crystal growing apparatus in accordance with the invention and showing the crystal pulling mechanism, with details of the furnace being omitted for sake of clarity;

FIG. 2 is a front plan view of the crystal-growing apparatus shown in FIG. 1, with certain parts shown in section; and FIG. 3 is a top plan view of the crystal growing apparatus shown in FIG. 1.

Referring to the drawings, the illustrated apparatus comprises a rigid bed 10 supported by a plurality of upstanding legs 12. Bed 10 has an enlarged opening 14. Although not shown, it is to be understood that in use the bed 10 is mounted in a fixed position above a conventional crystal growing furnace containing a crucible and die assembly, e.g., a furnace as shown by Mermelstein or U.S. Pat. No. 4,118,197, and the opening 14 is aligned with the die assembly.

The crystal pulling mechanism of the present invention is mounted upon rigid bed 10 and essentially comprises two sections, an adjustable base section shown generally within bracket 18 and a pulling mechanism section shown generally within bracket 20. As will become clear from the following description, the adjustable base section 18 permits alignment of the pulling mechanism section 20 with the die assembly in the crystal growing furnace.

The adjustable base section is mounted upon rigid bed 10 on four corner support blocks 20, 22, 24 and 26 (see FIG. 3). Fixedly secured to the tops of blocks 20, 22, 24 and 26 by suitable means such as screws 28 are a first set of shaft support blocks 30, 32, 34 and 36, respectively. The latter each have a horizontally extending hole 50. Mounted within holes 50 and extending generally parallel to one another between blocks 30 and 32, and blocks 34 and 36, respectively are first and second horizontal shafts 38 and 40.

Slidably mounted, one each on shafts 38 and 40, are first and second pillow blocks 42 and 44. Fixedly mounted on one of the shafts, e.g. shaft 40 is a bearing block 46. Secured to bearing block 46 is a threaded member 48. The latter is screwed into a threaded bushing 52 in block 46, and has an axial member in the form of a pin 54 which projects through a hole in block 46 and engages the adjacent side of an upstanding bracket member 56 on pillow block 44. Also included in a spring 58 which extends between bearing block 46 and an upstanding bracket member 59 on pillow block 44. As will become clear from the description following the foregoing assembly of parts permits adjustment of pillow block 44 back and forth in the direction of arrows 60 by changing the rotational position of threaded member 48. That is, turning threaded member 48 causes pin 54 to be extended or withdrawn with respect to pillow block 44, thereby carrying pillow block 44 with it.

Fixedly secured to the tops of pillow blocks 42 and 44, by suitable means such as screws 62, and extending generally parallel to one another between the pillow blocks blocks 42 and 44 are third and fourth horizontal shafts 64 and 66, respectively. As seen in FIG. 2, the ends of the shafts 64 and 66 are flattened to facilitate mounting to the pillow blocks. Shafts 64 and 66 are positioned with their long axes running generally parallel to one another, and perpendicular to the long axes of shafts 38 and 40. Slidably mounted, one each, on shafts 64 and 66 are a second set of pillow blocks 68 and 70, respectively. Fixedly mounted on one of the shafts, e.g. shaft 64, is a bearing block 72. Bearing block 72 is similar to bearing block 46 on shaft 40, and includes a threaded member 74 which is screwed into a threaded bushing 76 in the bearing block 72. Threaded member 74 has an axial member in the form of a pin 78 which projects through a hole in the bearing block 72 and engages the adjacent side of the main frame 80 of the crystal pulling mechanism section. The latter is fixedly secured to pillow blocks 68 and 70 and will be described in detail hereinafter. Also included is a spring 81 which extends between bearing block 72 and an upstanding bracket 82 on main frame member 80. One skilled in the art will recognize that the foregoing assembly of parts will permit adjustment of pillow block 68 back and forth in the direction of the arrows 85 by changing the rotational position of threaded member 74. Thus, turning threaded member 74 causes pin 78 to be extended or withdrawn with respect to main frame 80, thereby carrying pillow blocks 68 and 70 with it.

The pulling mechanism section 20 is mounted within main frame 80. The latter includes a horizontal base member 84 which is directly secured to the top of pillow blocks 68 and 70, and a pair of elongated vertical side frame members 86 and 88. One of the vertical side frame members, e.g. member 86 is slightly longer than the other side frame member 88. Rotatably mounted adjacent the lower ends of side frame members 86 and 88 in suitable bearing means indicated generally at 90 is a horizontal drive shaft 92. The latter is mechanically connected via an endless belt drive means 94 to a servo drive motor indicated generally at 96. Details of drive means 94 and the servo drive motor 96 have been omitted since such mechanisms are well known in the art, and are not necessary to an understanding of this invention. A cylindrical belt roller 98 is mounted on and keyed to shaft 92 for rotation therewith. Generally belt roller 98 will be formed of metal such as aluminum.

Referring in particular to FIGS. 1 and 2 a vertically extending slot 100 is formed in the upper end of vertical side frame member 86. Slot 100 serves as a support and guide channel for a first vertical slide block 102. Slide block 102 has a vertically extending hole 104 in which is rotatably mounted a threaded rod 106, the latter having a fixed knob 108 at one extremity, an axial extension in the form of a pin 110 at the other extremity, and a second locking knob 112 rotatably mounted on rod 106 between knob 108 and pin 110. Threaded rod 106 extends through slide block 102 and engages the bottom of slot 100. As will be obvious to one skilled in the art changing the rotational position of threaded rod 106 causes pin 110 to advance or retract relative to the bottom of slot 100 and this in turn causes slide block 102 to move up or down, i.e. in the direction of arrows 114.

A second vertically extending slot 116 is formed in the upper end of vertical side member 88 and serves as a support and guide channel for a second vertical side block 118. Slide block 118 is L-shaped and includes a horizontal boss 120. Horizontal boss 120 includes a threaded hole in which is mounted a vertically extending threaded rod 122. Rod 122 has a fixed knob 124 at one extremity, an axial extension in the form of a pin 126 at the other extremity, and a second locking knob 128 rotatably mounted on the rod 122 between knob 124 and boss 120. Pin 126 projects through horizontal boss 120 and engages the adjacent surface of a horizontal bracket 130. The latter is fixed to vertical side member 88 by suitable means such as screws 132.

A horizontal support rod 134 is mounted in and supported by vertical slide blocks 102 and 118. A second cylindrical belt roller 136 is rotatably mounted, in known manner, such as bearing means 138 on rod 134. An endless belt 140 made of a suitable material which will not stretch readily, e.g. fiber glass reinforced silicon rubber, is mounted around belt rollers 98 and 136. As will be seen from the drawings belt 140 has a vertical run. As mentioned supra, changing the rotational position of threaded rod 106 causes slide block 102 to move up or down, carrying rod 134 with it. Thus, one skilled in the art will recognize that belt 140 may be maintained under desired tension by adjusting the rotational position of threaded rod 106. In like manner, tracking of the belt is adjusted by changing the rotational position of threaded rod 122.

Referring in particular to FIG. 1, a pair of follower rollers indicated generally at 142 and 144, are mounted, vertically spaced from one another, adjacent the belt 140 vertical run. Follower rollers 142 and 144 are formed of metal such as aluminum and preferably are covered with silicon rubber. Follower rollers 142 and 144 are mounted on suitable bearings means, only one of which 145 is shown, for rotation on horizontal shafts 146 and 148, respectively. The latter are supported in a generally H-shaped support member 150. Support member 150 is pivotally mounted through short links 152 and 154 and suitable bushing means 156 to vertical side frame members 86 and 88. Completing the apparatus is a knob 160 which is fixed to H-shaped support member 150, and a pair of spring members only one of which 162 is shown, which are attached between H-shaped support member 150 and spring tensioning means indicated generally at 164. The latter are fixed to vertical side frame members 86 and 88. A feature and advantage of the present invention is that when frame 150 is lifted to permit a seed or crystal to be inserted between rollers 142, 144 and belt 140, gravity will act on frame 150 to keep rollers 142, 144 against the crystal and thus hold the crystal against belt 140 for proper gripping action. Springs 162 are provided to assist rollers 142 and 144 to track the growing crystal. Another advantage of the present invention is the ability of the pulling mechanism to permit thickness variations, seed-crystal junctions and minor ripples in the growing crystal to pass through the pulling mechanism, i.e. between the belt vertical run and the rollers 142 and 144 without sending wiggle down the crystal to the growth interface. Accordingly, support arms 152 and 154 should be of sufficient length to permit follower rollers 142 and 144 a freedom of movement away from the belt vertical run adequate to compensate for said variations and the like, e.g. 2 to 10 cm.

As will be clear to one skilled in the art the crystal pulling mechanism as described in the foregoing description constructed in accordance with this invention can accommodate crystal ripple, bend or buckle, surface imperfections such as impurity inclusions, and large seed junctions which might otherwise cause sufficient wiggle at the growth interface to break free of the meniscus and thus cause cessation of growth in conventional opposed belt pulling systems. Moreover, the pulling mechanism in accordance with the present invention is especially simple to construct, and permits ready access for mounting and aligning a seed in the pulling mechanism.

While the combination of a single pulling belt having a vertical run and a pair of follower rollers vertically spaced from one another and mounted on a single, pivotal support member as shown in the accompanying drawings is preferred in accordance with the present invention, one skilled in the art will recognize that two follower rollers may be separately pivotally mounted to belt puller main frame 80. Moreover, three or more follower rollers may be employed. However, two follower rollers generally provide sufficient crystal support and frictional contact with the belt for crystal pulling. Thus the use of more than two follower rollers generally is unnecessary and merely adds to the cost of the mechanism. On the other hand, a minimum of two follower rollers normally are required to provide sufficient support for the growing crystal.

Various changes may be made in the foregoing apparatus without departing from the spirit and scope of the invention. For example, by forming follower rollers 142 and 144 and support member 150 of materials of suitable mass, springs 162 and spring tensioning means 164 may be eliminated. Moreover, adjustable base 118 is merely one preferred form of adjustable base which may be employed, and may be modified by one skilled in the art. Still other changes will be obvious to one skilled in the art.

What is claimed is:

1. Apparatus for pulling a continuous crystalline body issuing from a melt, said apparatus comprising, a crystalline body gripping and pulling means adapted to be vertically supported above said melt and comprising: (1) an endless belt, (2) belt-supporting means for supporting said belt for movement along an endless path such that said path includes a vertical leg through which a portion of said belt extends, (3) a frame supporting said belt supporting means, (4) at least two independently-rotatable free-wheeling follower rollers (a) vertically spaced from one another adjacent the portion of the belt extending along said vertical leg, (b) pivotally connected to said frame by at least one link member, and (c) biased towards the portion of the belt extending along said vertical leg so as to be able to engage and maintain a crystalline body interposed between said belt and said rollers in contact with said belt, said rollers being movable between a first position wherein said rollers are spaced from said portion of the belt extending along said vertical leg and a second position wherein said rollers engage the portion of the belt extending along said vertical leg, wherein said at least one link member forms an acute angle with said vertical leg when said rollers are in said second position, and (5) drive means for operating said belt so that a crystalline body issuing from said melt and gripped by said crystalline body gripping and pulling means may be pulled upwards from said melt by movement of said belt.

2. Apparatus according to claim 1 and including spring means for biasing said follower rollers towards the portion of said belt which extends along said vertical leg.

3. Apparatus according to claim 1 wherein said drive means comprises a servo drive motor.

4. Apparatus according to claim 1 wherein said follower rollers are mounted on a common support for rotation about parallel axes, and said common support is pivotally mounted to said main frame.

5. Apparatus according to claim 1 further including means for adjusting tension in said belt.

6. Apparatus according to claim 1 further including means for adjusting tracking of said belt.

7. Apparatus according to claim 1 wherein said at least two follower rollers is less than three.

8. Apparatus according to claim 1 wherein said follower rollers are gravity biased towards said portion of the belt extending along said vertical leg.

9. Apparatus according to claim 1 wherein said follower rollers are spring biased towards said portion of the belt extending along said vertical leg.

10. Apparatus according to claim 1 wherein said follower rollers are mounted on a common support for rotation about parallel axes, said common support comprising first and second side members with said rollers extending between said first and second side members, and further wherein said common support is pivotally connected to said frame by means of said at least one link member.

11. Apparatus according to claim 10 wherein said follower rollers are gravity biased towards said portion of the belt extending along said vertical leg.

12. Apparatus according to claim 10 further including spring means connected between said common support and said frame for spring biasing said follower rollers towards said portion of the belt extending along said vertical leg.

13. Apparatus according to claim 1 further including means for adjustably positioning said crystalline body gripping and pulling means above said melt.

14. Apparatus according to claim 1 having a single endless belt.

15. Apparatus for pulling a continuous body issuing from a melt, said apparatus comprising a frame adapted to be positioned above said melt, and body gripping and pulling means attached to said frame, said gripping and pulling means comprising:

(1) an endless belt;

(2) support means attached to said frame for supporting said belt for movement along an endless path with said path having a vertical leg disposed above said melt;

(3) two follower rollers mounted on a common support member for independent rotation about parallel axes, and a link pivotally connecting said common support member to said frame such that (a) said two follower rollers lie vertically spaced from one another adjacent that portion of the belt extending along said vertical path, (b) said rollers are movable together away from that portion of the belt extending along said vertical path, (c) said two follower rollers are biased towards that portion of the belt extending along said vertical leg so that a body interposed between said rollers and said belt will be urged by said rollers into contact with said belt and (d) said link forms an acute angle with said vertical leg when said rollers are in engagement with said portion of the belt extending along said vertical leg; and (4) drive means for operating said belt so that a body issuing from said melt and gripped by said gripping means may be pulled upwards from the melt by movement of said belt.

16. Apparatus according to claim 15 further including spring means biasing said two follower rollers toward that portion of said belt which extends along said vertical leg.

* * * * *